United States Patent
Kuhn et al.

(10) Patent No.: US 6,689,212 B2
(45) Date of Patent: Feb. 10, 2004

(54) METHOD FOR GROWING AN α-SIC BULK SINGLE CRYSTAL

(75) Inventors: Harald Kuhn, Erlangen (DE); Rene Stein, Röttenbach (DE); Johannes Völkl, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/933,049

(22) Filed: Aug. 20, 2001

(65) Prior Publication Data

US 2002/0014199 A1 Feb. 7, 2002

Related U.S. Application Data

(63) Continuation of application No. PCT/DE00/00446, filed on Feb. 17, 2000.

(30) Foreign Application Priority Data

Feb. 19, 1999 (DE) .......................................... 199 07 143

(51) Int. Cl.[7] .......................... C30B 25/12; C30B 25/14
(52) U.S. Cl. ............................ 117/105; 117/81; 117/83
(58) Field of Search ............................. 117/81, 83, 105

(56) References Cited

U.S. PATENT DOCUMENTS 6,110,279 A * 8/2000 Kito et al. ................... 117/105

FOREIGN PATENT DOCUMENTS

DE          39 15 053 A1       11/1990
EP          0 712 150 A1       5/1996
WO          PCT/RU97/00005     7/1997

OTHER PUBLICATIONS

Chien et al.: "Terrace growth and polytype development in epitaxial β–SiC films on a α–SiC (6H and 15R) substrates", 1994 Materials Research Society J. Mater. Res., vol. 9, No. 4, Apr. 1994, pp. 940–954.

Heydemann et al.: "Sublimation growth of 4H–and 6H–SiC boule crystals", Diamond and Related Materials, NL, Elsevier Science Publishers, Amsterdam, vol. 6, No. 10, Jan. 8, 1997, pp. 1262–1265.

* cited by examiner

Primary Examiner—Felisa Hiteshew
(74) Attorney, Agent, or Firm—Laurence A. Greenberg; Werner H. Stemer; Gregory L. Mayback

(57) ABSTRACT

An α-SiC bulk single crystal is formed from an SiC gas phase by deposition of SiC on an SiC seed crystal. To enable an SiC bulk single crystal of the 15R type to be grown reproducibly and without restricting the seed crystal, the deposition takes place under a uniaxial tensile strength which includes a predetermined angle with the [0001] axis of the bulk single crystal, so that a rhombohedral crystal is formed.

11 Claims, 5 Drawing Sheets

METHOD FOR GROWING AN α-SIC BULK SINGLE CRYSTAL

CROSS-REFERENCE TO RELATED APPLICATION

This application is a continuation of copending International Application No. PCT/DE00/00446, filed Feb. 17, 2000, which designated the United States.

BACKGROUND OF THE INVENTION

Field of the Invention

The invention relates to a method for growing α-SiC bulk single crystals, wherein the bulk single crystal is formed from an SiC gas phase by the deposition of SiC on an SiC seed crystal. In this context, the term SiC gas phase is understood as meaning a gas phase comprising the components Si, SiC, $Si_2C$ and $SiC_2$. The term α-SiC bulk single crystals includes crystals of rhombohedral and hexagonal structure.

Silicon carbide (SiC) is the typical example of a substance which exhibits the appearance of polytypism (single-dimensional polymorphism). The literature has disclosed over 200 polytypic modifications, which are referred to here as polytypes. The polytypes have different physical properties, such as energy gap, electron mobility, and optical properties.

The most widely known polytypes are those which bear the designations 4H, 6H, 3C and 15R. In particular, the three polytypes 4H, 6H and 15R clearly have the same enthalpy of formation and therefore the same thermodynamic stability. Of these three polytypes, 4H and 6H are more common than the polytype 15R. It can therefore be assumed that the polytype 15R has a slightly lower thermodynamic stability than the other two polytypes.

Various methods for producing a 4H or 6H SiC bulk single crystal have become known. For example, U.S. Pat. No. 4,866,005, reissued as Re34861 (corresponding to European patent application EP 0 712 150 A1) and international PCT publication WO 97/27350 describe the production of a 6H SiC bulk single crystal. There, a 6H SiC seed crystal is used with a growth surface whose normal is tilted through 3° toward the [0001] crystal direction.

For some electronic applications, the 15R polytype has advantageous properties which make it of interest in particular for the fabrication of, for example, MOS transistors.

Chien, Nutt, Yoo, Kimoto, and Matsunami, describe, in Journal of Mater. Res. 9 (1994) 940 that 3C layers grow on 15R substrates without double position boundaries (DPBs). However, the reproducible production of SiC bulk single crystals is very difficult. Hitherto, 15R inclusions in substrate wafers have been purely random during production and were impossible to generate reproducibly.

In practice, it has not hitherto been possible to produce 15R crystals by means of epitaxy. This is so because in the case of epitaxial growth on a substrate with off-axis orientation, the epitaxial layers generally adopt the same modification as that which is predetermined by the substrate. By contrast, in the case of epitaxial growth on a substrate without off-axis orientation, it is predominantly the cubic modification, i.e. the 3C modification, which grows. Irrespective of this, only relatively thin layers can be produced with acceptable outlay using epitaxy.

SUMMARY OF THE INVENTION

It is accordingly an object of the invention to provide a method of growing an SiC bulk single crystal, which overcomes the above-mentioned disadvantages of the heretofore-known devices and methods of this general type and which can be used to grow SiC bulk single crystals of the type 15R reproducibly and without restriction to the seed crystal, so that the SiC bulk single crystals are suitable as a substrate for a semiconductor component (under certain circumstances with a following epitaxial layer).

With the foregoing and other objects in view there is provided, in accordance with the invention, a method of growing an α-SiC bulk single crystal, which comprises:

depositing SiC from gas phase on a seed crystal and growing a bulk single crystal under uniaxial tensile stress enclosing a predetermined angle with a [0001] axis of the bulk single crystal, and thereby forming a rhombohedral crystal.

The invention is based on the idea of exposing the growing crystal to a uniaxial tensile stress which has a component in the <11$\bar{2}$0> direction. In this context, <11$\bar{2}$0> denotes a vector in the reference system of the crystal which points in the [11$\bar{2}$0] direction, the numbers in the pointed or square brackets being the indices. The use of the pointed brackets means that all symmetrically equivalent vectors in this crystal system are intended to be indicated.

The method according to the invention for growing α-SiC bulk single crystals, wherein the bulk single crystal is formed from an SiC gas phase by deposition of SiC on an SiC seed crystal is characterized in that the deposition takes place under a uniaxial tensile stress which includes a predetermined angle with the [0001] axis of the bulk single crystal.

In a first preferred embodiment, the uniaxial tensile stress is generated by a temperature field, the axial gradient of which includes the predetermined angle with the [0001] axis of the bulk single crystal. Furthermore, in the axial direction the temperature field has a non-vanishing second position derivative of the temperature. It is therefore the case that $d^2T/dx^2 \neq 0$, where T denotes the temperature and x denotes the axial position coordinate. In this context, the term axial means in the direction of growth, while radial accordingly represents an orientation which is perpendicular to the direction of growth.

In accordance with a further preferred embodiment, the uniaxial tensile stress is generated by a mass flow of SIC which, by the expedient of a diaphragm system, is directed onto the bulk single crystal at the predetermined angle with respect to the [0001] axis of the bulk single crystal.

In accordance with again a further preferred embodiment, the uniaxial tensile stress is generated by orientation of the seed crystal, so that the normal to a growth surface of the seed crystal includes the predetermined angle with the [0001] axis of the bulk single crystal. In this case too, the temperature field has a non-vanishing second position derivative of the temperature in the axial direction. The relationship $d^2T/dx^2 \neq 0$ applies once again. The growth surface of the seed crystal is preferably inclined in a <11$\bar{2}$0> direction by the predetermined angle.

The predetermined angle is preferably between 2° and 10°.

In accordance with yet again a further preferred embodiment, the uniaxial tensile stress is generated by orientation of the seed crystal, so that the normal to a growth surface of the seed crystal includes the predetermined angle with the [0001] axis of the bulk single crystal. In this case, in addition to this special orientation of the seed crystal, an inhomogeneous radial temperature profile, i.e. a radial temperature gradient, is established, so that curved isotherms result. The curved isotherms run substantially in the radial direction. To generate the uniaxial tensile stress, it is particularly expedient if the isotherms have a radius of curvature which is at most 4 times the diameter of the bulk single crystal.

In a further preferred embodiment, the uniaxial tensile stress is generated by fitting the bulk single crystal into a tube during growth. The tube then exerts a non-uniform pressure on the growing crystal.

The seed crystal is preferably oriented in such a manner that the growth of SiC takes place on that side of the seed crystal on which the Si atoms are situated.

One advantage of the method according to the invention consists in the fact that α-SiC bulk single crystals, in particular of type 15R, can be grown reproducibly and with a high yield with relatively little outlay, while amazingly the polytype of the seed used is of little or no importance.

Other features which are considered as characteristic for the invention are set forth in the appended claims.

Although the invention is illustrated and described herein as embodied in a method for growing an α-SiC bulk single crystal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

If the 15R polytype is regarded as a 6H polytype with a regular arrangement of stacking faults, it is in principle theoretically possible to construct a 15R crystal from a 6H crystal by displacing the corresponding SiC double layers in the <11$\bar{2}$0> direction. The stacking fault energy is only 1.67 kJ/mol (0.4 kcal/mol). The invention provides a method with which a stacking fault of this type can be produced in practice and reproducibly. The controllable production of the stacking fault is achieved by exposing the growing crystal to a uniaxial tensile stress with a component in the <11$\bar{2}$0> direction. For this purpose, a seed crystal with off-axis orientation is used for the deposition of SiC from the gas phase. Incorporating the seed with an off-axis orientation (inclination) of between 2° and 10° in a <11$\bar{2}$0> direction, it is possible to achieve the effect whereby a temperature gradient which in the sublimation growth installation acts axially, i.e. in the direction of growth no longer acts in the direction of the [0001] axis, but rather a part of the stress generated by the temperature gradient acts parallel to the (0001) lattice plane. This applies in particular if the temperature field in the sublimation growth installation also has a section with a non-vanishing second position derivative in the axial direction ($d^2T/dx^2 \neq 0$, where T=temperature and x=axial spatial coordinate). This allows incorporation of "zigzag chains" which is no longer symmetrical. As a result, the 15R modification is formed instead of the 6H modification. However, the production of the asymmetric arrangement of the chains of Si and C atoms is only successful if the growth takes place with the deviation of at least 2° to 10° with respect to the direction of the crystallographic, polar [000+1] direction. This means that the (0001)-Si surface of the seed with such an off-axis orientation is the growth surface for the SiC bulk single crystal which is to be grown.

The seed crystal may also have an off-axis orientation of the magnitude of the angle of between 2° and 10° toward a crystal orientation which deviates from the <11$\bar{2}$0> direction. The deviation from the <11$\bar{2}$0> direction may in this case be up to 30°.

Figure 1:
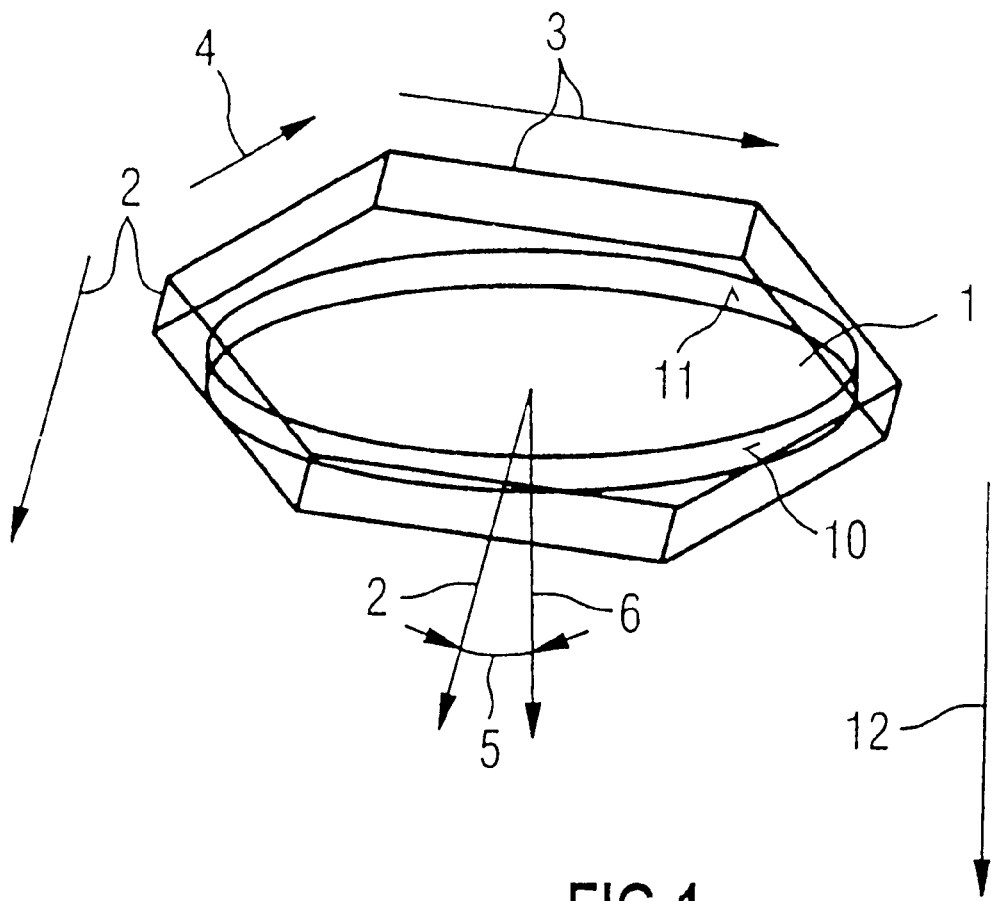
FIG. 1 is a diagram showing the orientation of the significant axes in the method according to the invention for growing a 15R Sic bulk single crystal.

Referring now to the figures of the drawing in detail and first, particularly, to FIG. 1 thereof, there is shown a hexagonal crystal structure 1 with a crystal axis. A seed crystal comprising SiC is denoted by 1. The lattice cell of the seed crystal 1 is symbolically indicated in FIG. 1. The basic area of the lattice cell is defined by two vectors 3 and 4 <11$\bar{2}$0> and <11$\bar{1}$0>, respectively. A third vector 2 in the hexagonal lattice cell, which encloses the volume of the lattice cell, is the vector [0001]. It is identical to the crystal axis of the seed crystal 1 and, in the illustration shown, encloses an angle 5 with a normal 6 to the seed crystal 1. The normal 6 to the seed crystal 1 is perpendicular to the surface of the seed crystal on which the SiC is deposited from the gas phase for the purpose of forming the bulk single crystal. In a first embodiment of the method according to the invention, the angle 5 is between 2° and 10°. (In this case, the angle 5 is the angle between the direction of growth and the [0001] vector 2 of the bulk single crystal.)

The arrow 12 indicates the direction of growth of the crystal that is to be grown on. The direction of growth will be explained in more detail below.

Figure 2A:
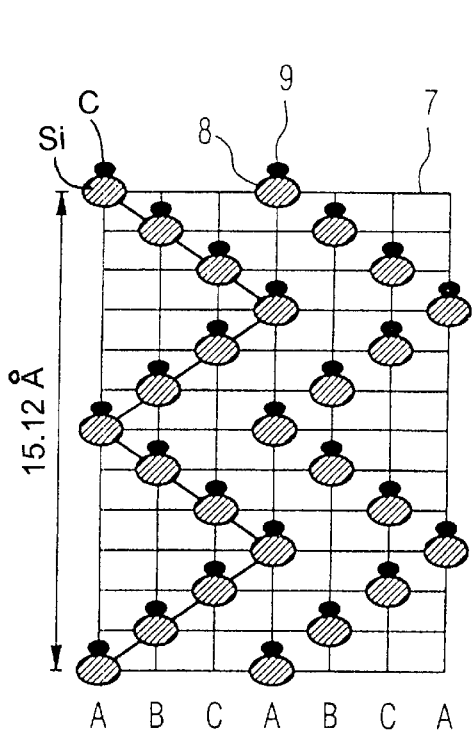
FIG. 2A is a lattice diagram showing the arrangement of the atoms in the lattice of the 6H SiC bulk single crystal.
Figure 2B:
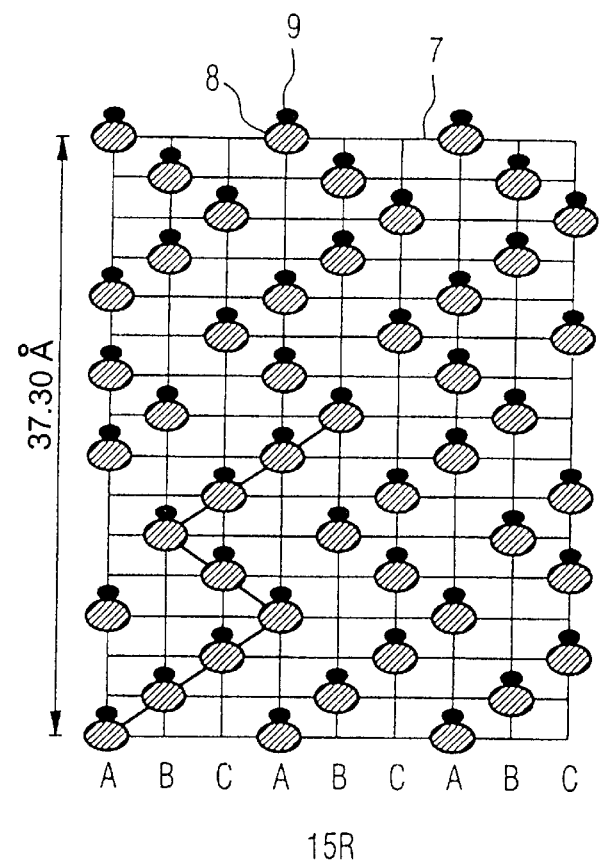
FIG. 2B is a lattice diagram showing the arrangement of the atoms in the lattice of the 15R SiC bulk single crystal.

FIGS. 2A and 2B show simplified illustrations of the arrangement of the atoms in the lattice in the direction of the third vector [0001] of the lattice cell. The atoms in the SiC lattice are situated in superposed planes. Furthermore, they adopt a defined distance from one another in the lateral direction. In FIGS. 2A and 2B, this is in each case indicated by a grid of auxiliary lines 7. Small solid circles indicate the C atoms 9, while larger shaded circles indicate the Si atoms 8 in the SiC lattice.

The sequence of the atoms of an SiC crystal of 6H structure is shown in FIG. 2A. The SiC atoms successively arrange themselves one level higher and one level shifted to the right during growth. At the fourth level, the direction of the lateral offset is reversed, so that the next atoms are no longer incorporated offset to the right of the previous atom, but rather are offset to the left of the previous atom. After another four levels, this lateral offset is reversed once more. The number of atoms incorporated in the lattice with an offset to the right is identical to the number of atoms incorporated in the lattice with an offset to the left, resulting in a "zigzag chain" with links of identical length. The adjacent levels in FIGS. 2A and 2B on the horizontal axis are denoted by A, B, C. After six layers, a point which is equivalent to the starting point is reached. A lattice period, i.e. the distance of six layers to the first repetition, has a length of 1.512 nm (15.12 Å).

FIG. 2B shows the layer sequence for a 15R lattice. The difference between the crystallization in 6H and in 15R consists in the fact that the number of levels which are incorporated in the lattice with an offset to the right in a 15R crystal is greater by one than the number of levels which are incorporated in the lattice with an offset to the left. The "zigzag chain" no longer has links of equal length. Therefore, as it builds up, the chain "migrates" to the right. After sixteen layers, however, a point which is equivalent to the starting point is reached even with the 15R lattice. The lattice period with the 15R crystallization is 3.73 nm (37.30 Å).

To stabilize 15R SiC, it is particularly expedient for the growth to take place in the direction of the Si side of the polar [0001] axis. Therefore, the seed crystal 1 is oriented in such a manner that the Si atoms 8 form the termination on a first side 10 of the seed crystal 1, and the C atoms 9 form the termination on a second side 11 of the seed crystal 1. The growth therefore takes place on the first side 10, which is situated at the bottom in FIG. 2A and FIG. 2B: the growth takes place with the growth direction 12 from the top downward.

Figure 3A:
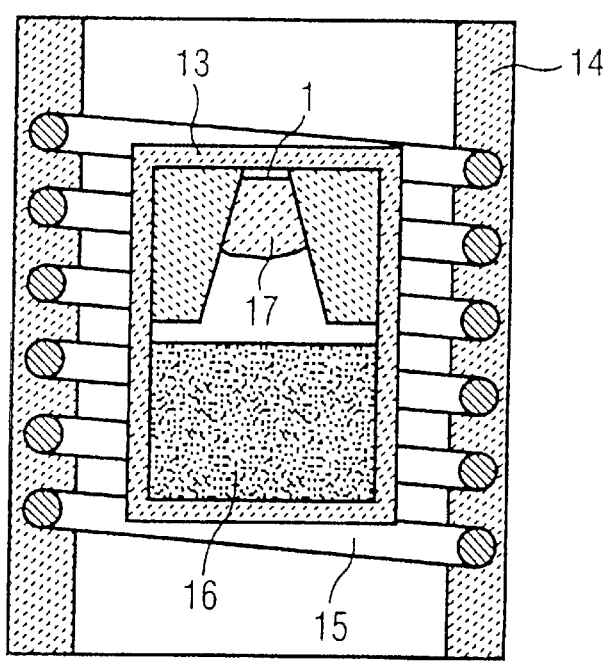
FIG. 3A is a sectional view taken through a configuration for growing a bulk single crystal.
Figure 3B:
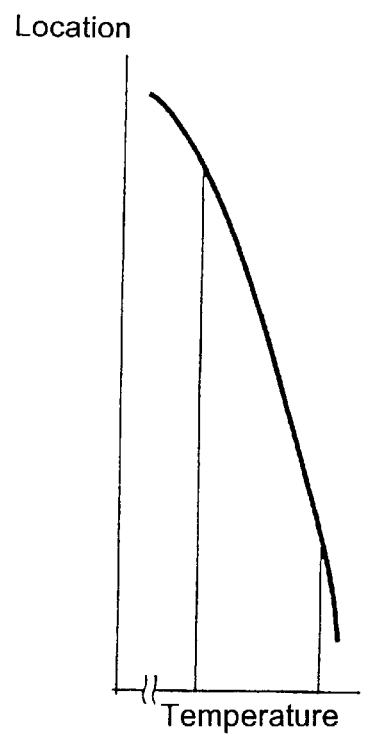
FIG. 3B is a temperature profile for growing a bulk single crystal using the method according to the invention.

FIGS. 3A and 3B show a device for carrying out the method according to the invention and its temperature profile, respectively. A crucible 13 is arranged in a furnace 14 which, by means of heating windings or induction coils 15, is heated to a mean temperature of more than 2200° C. The growth crucible may in particular be an inductively heated growth crucible. The SiC seed crystal 1 is attached to the upper end (the cover) of the crucible 13. SiC powder 16 at the lower end of the crucible 13 is sublimed by the high temperature and is deposited, as a growing SiC bulk single crystal 17, on the seed crystal 1. The temperature distribution is such that a higher temperature prevails at the lower end of the furnace while a lower temperature prevails at the upper end of the furnace. This temperature profile is illustrated in FIG. 3B, wherein the temperature is plotted on the horizontal axis and the height in the furnace 14 is plotted on the vertical axis. The temperature field is practically rotationally symmetrical. The temperature profile shown in FIG. 3B has a curvature and therefore a section where $d^2T/dx^2=0$. This makes a significant contribution to the uniaxial tensile stress which is required for the 15R growth.

In the latter embodiment of the method according to the invention, the uniaxial tensile stress is also achieved by orientation of the seed crystal 1 so that the normal to the surface of the seed crystal 1 includes a predetermined angle with the [0001] axis 2 of the bulk single crystal.

Instead of grinding the seed crystal 1 so that it has an inclination corresponding to the predetermined angle 5, the uniaxial tensile stress can also be generated by means of a rotationally symmetrical temperature field, the axis of symmetry of which does not coincide with the crystal axis. In a further embodiment, by contrast, the temperature field is not rotationally symmetrical.

In addition, or in a further embodiment of the production process, the uniaxial tensile stress may be generated by asymmetric growth. This can be achieved, for example, by diverting the mass flow of the SiC gas species through a diaphragm system in the furnace, so that after a predetermined time the SiC bulk single crystal 17 has grown further on one side than on the other side. Consequently, the normal to the surface of the growth phase boundary is at an angle with respect to the [0001] axis 2 of the SiC bulk single crystal 17. In the case of a curved phase boundary, this expression is understood to mean the mean surface normal.

Figure 4:
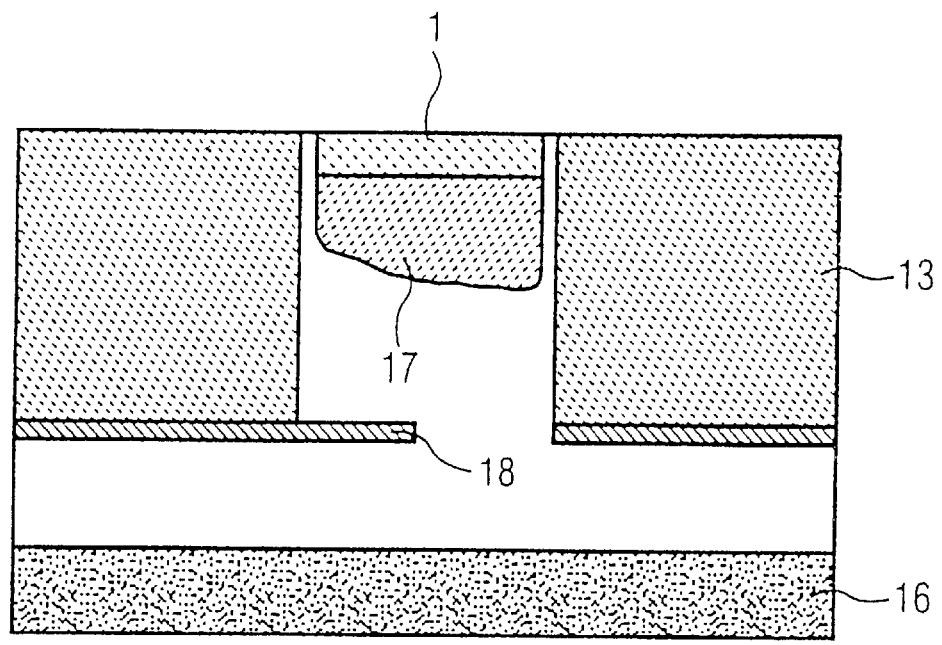
FIG. 4 is a detail of a configuration for growing the crystal using the method according to the invention.

A diaphragm system of this type with a diaphragm 18 is shown in FIG. 4. The diaphragm 18 is arranged in such a way that the mass flow comprising the SiC gas phase onto the growing SiC bulk single crystal 17 is greater on one side of the SiC bulk single crystal 17 than on the opposite side of the SiC bulk single crystal 17: the principal aperture of the diaphragm 18 is not arranged centrally with respect to the axis of symmetry of the seed crystal 1. Consequently, vaporized SiC from the holding region 16 flows more toward one side of the growing SiC bulk single crystal 17, and is deposited to a greater extent on that side of the SiC bulk single crystal 17 which lies opposite the aperture of the diaphragm 18 than on that side of the SiC bulk single crystal 17 which is "shaded" by the diaphragm 18.

Figure 5:
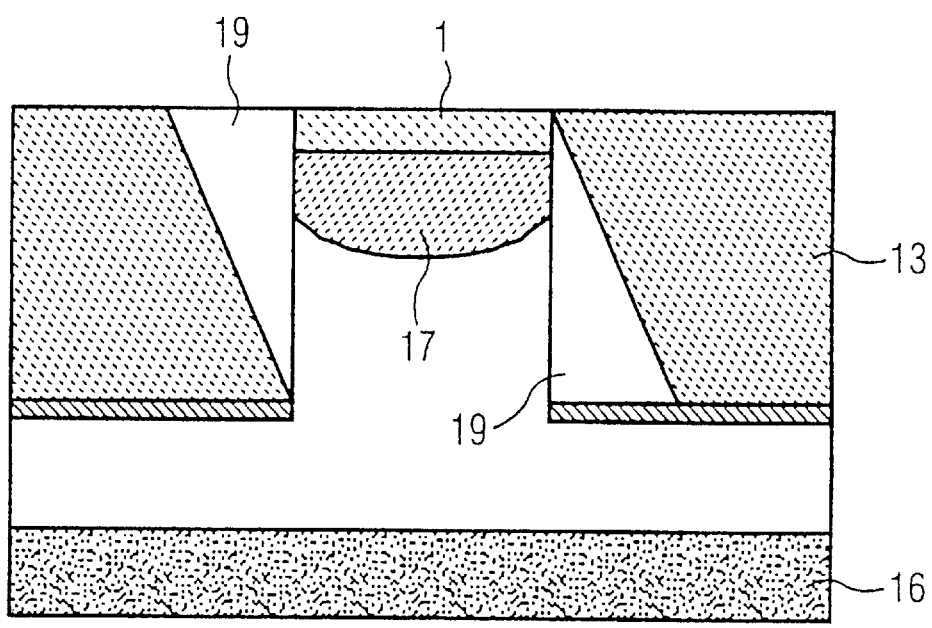
FIG. 5 is a detail of a further configuration for growing the crystal using the method according to the invention.

Moreover, a uniaxial tensile stress, the resultant of which acts in the predetermined angle 5, can be exerted on the SiC bulk single crystal 17 during the growth by means of mechanical devices. A corresponding device is shown in FIG. 5. The seed crystal 1 is arranged in a tube 19, wherein the thickness of the tube wall is dependent on the height and on the direction perpendicular to the axis of the tube 19. By way of example, in the embodiment shown in FIG. 5, the thickness of the tube wall at the level of the seed crystal 1 on the left-hand side is very great, while the opposite wall on the right is very thin. The result is that the expansion of the tube 19 caused by the high temperature in the furnace is greater on the side of the thick wall than at the thin wall on the opposite side. In this way, the SiC bulk single crystal 17 is forced into "skewed" growth. In this context, it should be ensured that the expansion coefficient of the material from which the tube 19 is produced differs from that of SiC and also from that of the surrounding crucible 13. As a result, the temperature gradient which prevails during the growth applies the tensile stress to the SiC bulk single crystal 17, and during cooling the SiC bulk single crystal 17 is subject to a shearing force, so that the desired asymmetric "zigzag chain" of the atoms in the SiC bulk single crystal 17 is produced.

Figure 6:
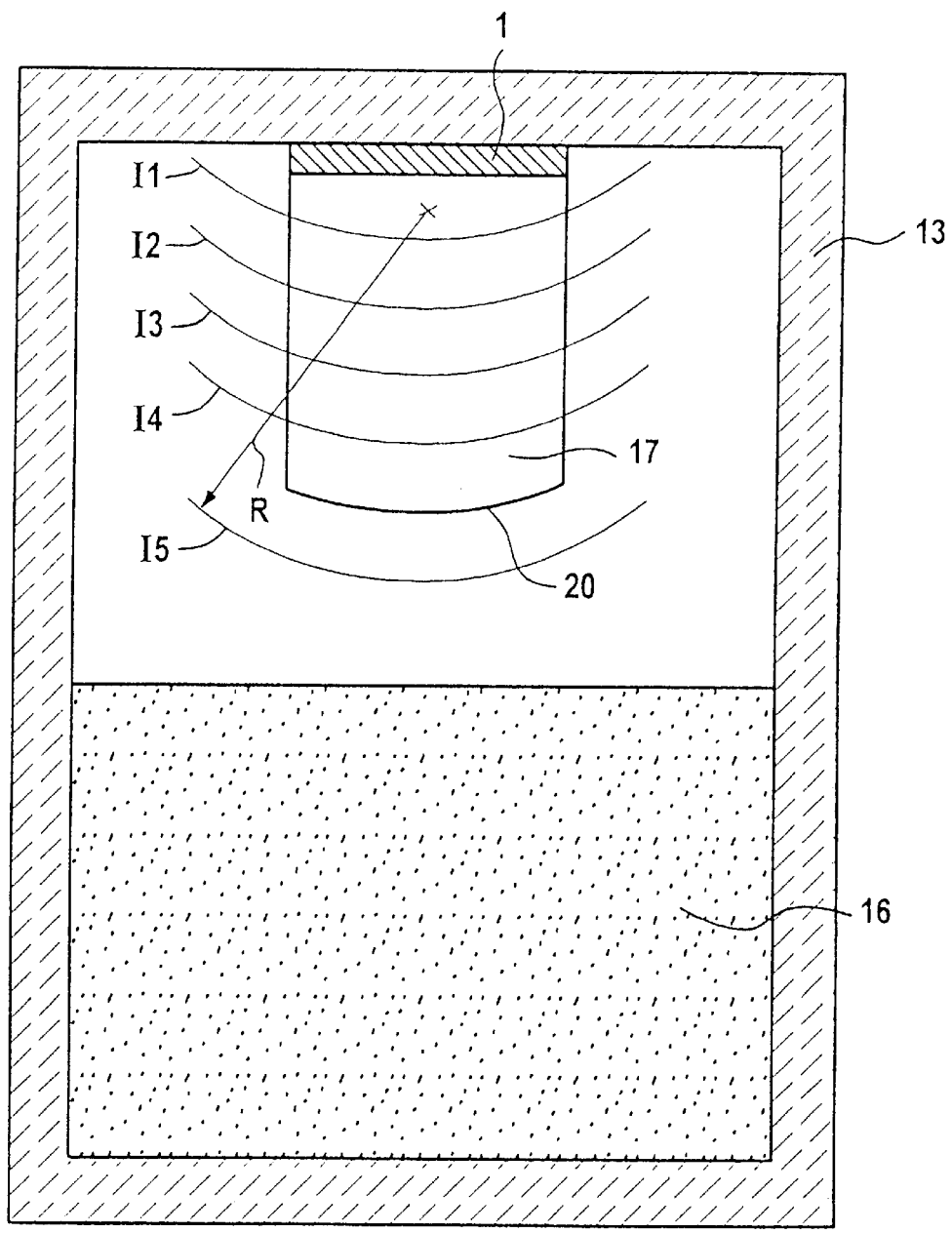
FIG. 6 is a further sectional diagram showing another configuration for growing the crystal using an inhomogeneous radial temperature profile.

As well as or in addition to the axial temperature profile which is shown in FIG. 3B and is wherein in particular by a non-vanishing second position derivative in the axial direction, it is also possible for an inhomogeneous radial temperature profile within the crucible 13, in combination with an SiC seed crystal 1 whose normal is tilted toward the [0001] crystal direction to effect a uniaxial tensile stress which is beneficial to the 15R growth. An advantageous radial temperature profile of this type can be described most easily through its isotherms. By way of example, FIG. 6 shows five non-planar isotherms I1 to I5, all of which have a curvature with a radius of curvature R. To form a uniaxial stress which is sufficient for rhombohedral crystal growth, it is expedient to establish a temperature profile with isotherms I1 to I5 whose radius of curvature is at most 4 times as great as the diameter of the growing SiC bulk single crystal 17. In the example shown in FIG. 6, the SiC bulk single crystal 17 has a diameter of about 2 inches and the radius of curvature is 180 mm. With a transfer of material from the stock of SiC powder 16 to the growing SiC bulk single crystal 17 which is homogeneous over the cross section of the crucible 13, the non-planar, convex profile of the isotherms I1 to I5 is reproduced in a crystal growth surface 20. The growth surface 20 is then of the same shape as the isotherms I1 to I5.

The method according to the invention allows the production of α-SiC bulk single crystals, in particular with a rhombohedral 15R crystal structure, for semiconductor wafers and substrates. Silicon carbide wafers with a 15R crystal structure have particularly advantageous properties for some electronic applications, in particular MOS transistors. In further processing steps, cubic SiC epitaxial layers for electronic applications can be grown on the 15R SiC.

We claim:

1. A method of growing an α-SiC bulk single crystal, which comprises:

providing an SiC seed crystal;

depositing SiC from gas phase on the seed crystal and growing a bulk single crystal under a uniaxial tensile stress enclosing a given angle with a [0001] axis of the bulk single crystal, and thereby forming a rhombohedral crystal.

2. The method according to claim 1, which comprises generating the uniaxial tensile stress with a defined temperature field having an axial gradient enclosing the given angle with the [0001] axis of the bulk single crystal and having an axial temperature profile with a non-vanishing double derivative toward an axial spatial coordinate.

3. The method according to claim 1, which comprises generating the uniaxial tensile stress by depositing the SiC from gas phase flowing via a diaphragm system at the given angle with respect to the [0001] axis of the bulk single crystal.

4. The method according to claim 1, which comprises generating the uniaxial tensile stress by a given orientation of the seed crystal such that a normal to a growth surface of the seed crystal encloses the given angle with the [0001] axis of the bulk single crystal, and establishing an axial temperature profile with a non-vanishing double derivative toward the axial spatial coordinate.

5. The method according to claim 4, which comprises inclining the growth surface of the seed crystal in a <11$\bar{2}$0> direction by the given angle.

6. The method according to claim 1, which comprises generating the uniaxial tensile stress by orienting the seed crystal such that a normal to a growth surface of the seed crystal encloses the given angle with the [0001] axis of the bulk single crystal, and establishing an inhomogeneous radial temperature profile, defined by curved isotherms having a radius of curvature of at most four times a diameter of the bulk single crystal.

7. The method according to claim 6, which comprises inclining the growth surface of the seed crystal in a <11$\bar{2}$0> direction by the given angle.

8. The method according to claim 1, which comprises generating the uniaxial tensile stress by fitting the bulk single crystal into a tube and causing the tube to exerts a pressure on the growing crystal, and to thereby cause the uniaxial tensile stress enclosing the given angle with the [0001] axis of the bulk single crystal.

9. The method according to claim 1, which comprises setting the given angle to between 2° and 10°.

10. The method according to claim 1, which comprises orienting the seed crystal such that SiC grows on a side of the seed crystal on which Si atoms are situated.

11. The method according to claim 1, which comprises orienting the seed crystal such that SiC grows on a side of the seed crystal on which C atoms are situated.

\* \* \* \* \*